US009735291B1

(12) United States Patent
Chiou et al.

(10) Patent No.: US 9,735,291 B1
(45) Date of Patent: Aug. 15, 2017

(54) SEMICONDUCTOR DEVICE AND ZENER DIODE

(71) Applicant: Macronix International Co., Ltd., Hsinchu (TW)

(72) Inventors: Chun-Ming Chiou, Taoyuan (TW); Yu-Jui Chang, Hsinchu (TW); Cheng-Chi Lin, Yilan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/066,624

(22) Filed: Mar. 10, 2016

(51) Int. Cl.
*H01L 29/78* (2006.01)
*H01L 29/866* (2006.01)
*H01L 29/06* (2006.01)
*H01L 29/66* (2006.01)

(52) U.S. Cl.
CPC ........ *H01L 29/866* (2013.01); *H01L 29/0607* (2013.01); *H01L 29/0649* (2013.01); *H01L 29/0684* (2013.01); *H01L 29/66106* (2013.01)

(58) Field of Classification Search
CPC ......... H01L 2924/00; H01L 2924/0002; H01L 27/0255; H01L 27/0262; H01L 2224/48091; H01L 2924/13091; H01L 2924/00014; H01L 29/0615; H01L 29/0619; H01L 29/0692; H01L 29/732; H01L 29/7436; H01L 29/87
USPC .................. 257/173, 355, E21.388, E21.694, 257/E27.016, E27.103, E29.012, E29.013, 257/E29.026, E29.114, E29.146, E29.182, 257/E29.183, E29.187, E29.202, E29.211, 257/E29.225, E29.258, E29.262, 109, 257/112, 133, 146, 314, 328, 341, 343, 257/367, 370; 438/133
See application file for complete search history.

(56) References Cited

U.S. PATENT DOCUMENTS

| | | | | |
|---|---|---|---|---|
| 6,365,932 B1* | 4/2002 | Kouno | ................ | H01L 27/0255 257/133 |
| 2005/0073006 A1* | 4/2005 | Pequignot | ........... | H01L 27/0255 257/355 |
| 2006/0220138 A1* | 10/2006 | Dudek | ................ | H01L 27/0255 257/367 |
| 2007/0262386 A1* | 11/2007 | Gossner | .............. | H01L 27/0262 257/355 |
| 2008/0061347 A1* | 3/2008 | Mallikararjunaswamy | | H01L 27/115 257/314 |

(Continued)

*Primary Examiner* — Edward Chin
(74) *Attorney, Agent, or Firm* — Fish & Richardson P.C.

(57) ABSTRACT

A semiconductor device includes a substrate; a well region of a first-conductivity-type, disposed in the substrate; a first impurity region of a first-conductivity-type disposed in the well region; a second impurity region of the second-conductivity-type disposed in the well region, the second-conductivity-type being opposite to the first-conductivity-type; a third impurity region disposed in the well region, a portion of the first impurity region overlapping a first portion of the third impurity region, a portion of the second impurity region overlapping a second portion of the third impurity region, and a third portion of the third impurity region being disposed between the first impurity region and the second impurity region; and a fourth impurity region and a barrier layer disposed in the substrate, the fourth impurity region and the barrier layer enclosing the well region from around and below, respectively.

17 Claims, 9 Drawing Sheets

(56) References Cited

U.S. PATENT DOCUMENTS

| | | | | |
|---|---|---|---|---|
| 2008/0179624 A1* | 7/2008 | Russ | ............... | H01L 27/0262 257/173 |
| 2010/0176443 A1* | 7/2010 | Takaishi | ............. | H01L 29/7828 257/328 |
| 2014/0167099 A1* | 6/2014 | Mergens | ............... | H01L 29/87 257/109 |
| 2015/0108536 A1* | 4/2015 | Pan | ............... | H01L 29/0615 257/112 |

* cited by examiner (Prior Art)

| Layer Desc. | Implant | Dosage (atoms/cm3) |
|---|---|---|
| NBL | Arsenic | 2E16 |
| Nbase | Phosphor | 0.3~15 E17 |
| PW | Boron | 1.5~2 E16 |
| NW | Phosphor | 0.5~1.5 E16 |

FIG. 6

SEMICONDUCTOR DEVICE AND ZENER DIODE

TECHNICAL FIELD

The following disclosure relates generally to a semiconductor device and, more particularly, to a semiconductor device including a Zener diode.

BACKGROUND

In general, a Zener diode operates with a reverse bias voltage when the Zener diode is included in a circuit. When this reverse bias voltage applied to the Zener diode exceeds a certain value, the current flowing through the diode rises rapidly due to the electron tunneling effect. This reverse bias voltage is referred to as the Zener breakdown voltage. The current flow in the forward direction of a Zener diode is similar to that of a traditional diode.

SUMMARY

In one aspect, some implementations provide a semiconductor device having a Zener diode. The semiconductor device includes a substrate; a well region of a first-conductivity-type, disposed in the substrate; a first impurity region of a first-conductivity-type disposed in the well region; a second impurity region of the second-conductivity-type disposed in the well region, the second-conductivity-type being opposite to the first-conductivity-type; a third impurity region disposed in the well region, a portion of the first impurity region overlapping a first portion of the third impurity region, a portion of the second impurity region overlapping a second portion of the third impurity region, and a third portion of the third impurity region being disposed between the first impurity region and the second impurity region; and a fourth impurity region and a barrier layer disposed in the substrate, the fourth impurity region and the barrier layer enclosing the well region from around and below, respectively.

Implementations may include one or more of the following features.

The third impurity region may be of the second-conductivity-type while the fourth impurity region may also be of the second-conductivity-type. The semiconductor device may further include a fifth impurity region disposed in the substrate and surrounding the fourth impurity region. The fifth impurity region may be of the first-conductivity-type. The fourth impurity region and the barrier layer may form a charge barrier that blocks a leakage current from within the charge barrier to the fifth impurity region or to the substrate. A forward bias may be applied to the first impurity region and the third impurity region. The leakage current being blocked may emancipate from active regions of the first impurity region or the second impurity region. The fourth impurity region may be connected to the first impurity region by metal routing of the semiconductor device.

The semiconductor device may further include: a dielectric layer disposed on the dielectric layer disposed on the substrate; a six impurity region disposed in the fourth impurity region, the six impurity region having the same conductivity type as the fourth impurity region but doped with a higher concentration of dopants than the fourth impurity region; a first electrode coupled to the first impurity region via the dielectric layer; a second electrode coupled to the second impurity region via the dielectric layer; a third electrode coupled to the six impurity region via the dielectric layer, and wherein the third electrode may be shorted to the first electrode such that the sixth impurity region is electrically connected to the first impurity region and that a leakage current—from within the charge barrier to the fifth impurity region or to the substrate—may be blocked.

The semiconductor device may further include a first isolation region located between an outer boundary of the third impurity region and an inner boundary of the fourth impurity region, and a second isolation region located between an outer boundary of the fourth impurity region and an inner boundary of the fifth impurity region.

The second impurity region may have a doping concentration greater than a doping concentration of the third impurity region. The first impurity region may have a first plurality of branches while the second impurity region may have a second plurality of branches. At least one portion of the first plurality of branches of the first impurity region may interlace with at least one portion of the second plurality of branches of the second impurity region.

In another aspect, some implementations provide a semiconductor device having a Zener diode. The semiconductor device includes a substrate; a well region of a first-conductivity type, disposed in the substrate; a first impurity region of a first-conductivity-type disposed in the well region; a second impurity region of the second-conductivity-type disposed in the well region, the second-conductivity-type being opposite to the first-conductivity-type; a third impurity region disposed in the well region, wherein a portion of the third impurity region is disposed between the first impurity region and the second impurity region; and a fourth impurity region and a barrier layer disposed in the substrate, the fourth impurity region and the barrier layer respectively enclosing the well region from around and below to form a charge barrier.

Implementations may include one or more of the following features.

Second impurity region may be located within the third impurity region, and wherein the second impurity region may have a doping concentration greater than a doping concentration of the third impurity region. No bias voltage may be applied between the fourth impurity region and the first impurity region. The semiconductor device may further include a fifth impurity region disposed in the substrate and surrounding the fourth impurity region, a first isolation region between an outer boundary of the third impurity region and an inner boundary of the fourth impurity region, and a second isolation region between an outer boundary of the fourth impurity region and an inner boundary of the fifth impurity region.

The first impurity region may have a first plurality of branches while the second impurity region may have a second plurality of branches, and wherein at least a first portion the first plurality of branches and at least a second portion of the second plurality of branches may be complementary in shape.

In yet another aspect, some implementations provide a method for manufacturing a semiconductor device having a Zener diode. The method includes: introducing dopants of a second-conductivity type in a substrate to form a barrier layer; introducing dopants of a first-conductivity-type to form a well region over the barrier layer, wherein the first-conductivity-type is opposite to the second-conductivity-type; forming a fourth impurity region of the second-conductivity-type that surrounds the well region; forming at least one third impurity region of the first-conductivity-type in the well region; forming a first impurity region of the first-conductivity-type in the well region such that a first portion of the first impurity region overlaps a first portion of the at least one third impurity region; and forming a second impurity region of the second-conductivity-type in the third impurity region such that a second portion of the at least one third impurity region is disposed between the first impurity region and the second impurity region, wherein the fourth impurity region and the barrier layer enclose the well region from around and below, respectively.

Implementations may include one of more of the following features.

The first impurity region may have a first plurality of branches while the second impurity region may a second plurality of branches, and wherein at least a first portion the first plurality of branches and at least a portion of the second plurality of branches may be complementary in shape.

DETAILED DESCRIPTION

Hereinafter, embodiments consistent with the disclosure will be described with reference to the drawings. Wherever possible, the same reference numbers will be used throughout the drawings to refer to the same or like parts.

The basic structure of a Zener diode includes a p-n junction. The Zener breakdown voltage can be adjusted by selecting an appropriate doping material and concentration. Zener diodes may include doping areas that have the shape of a rectangle. Generally, Zener diode (even a normal diode) embedded in CMOS process can operate at reverse bias but not at a forward bias due to the parasitic bipolar that would be turned on. The disclosure generally deals with examples of a Zener device structure as well as metal routing of an on-chip Zener-diode. As used herein, a Zener diode refers to an on-chip Zener diode device.

Figure 1A:
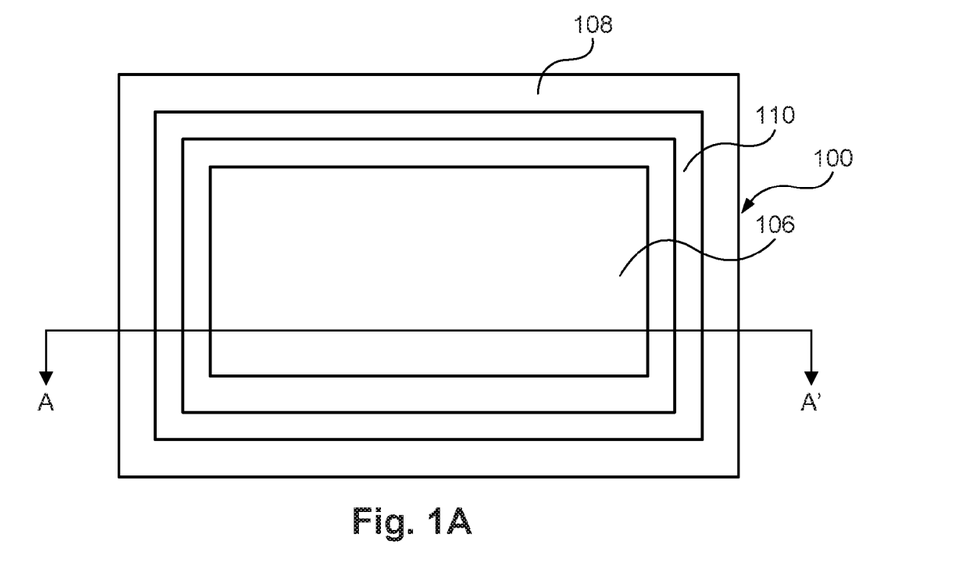
FIG. 1A shows a plan view of a conventional Zener diode.
Figure 1B:
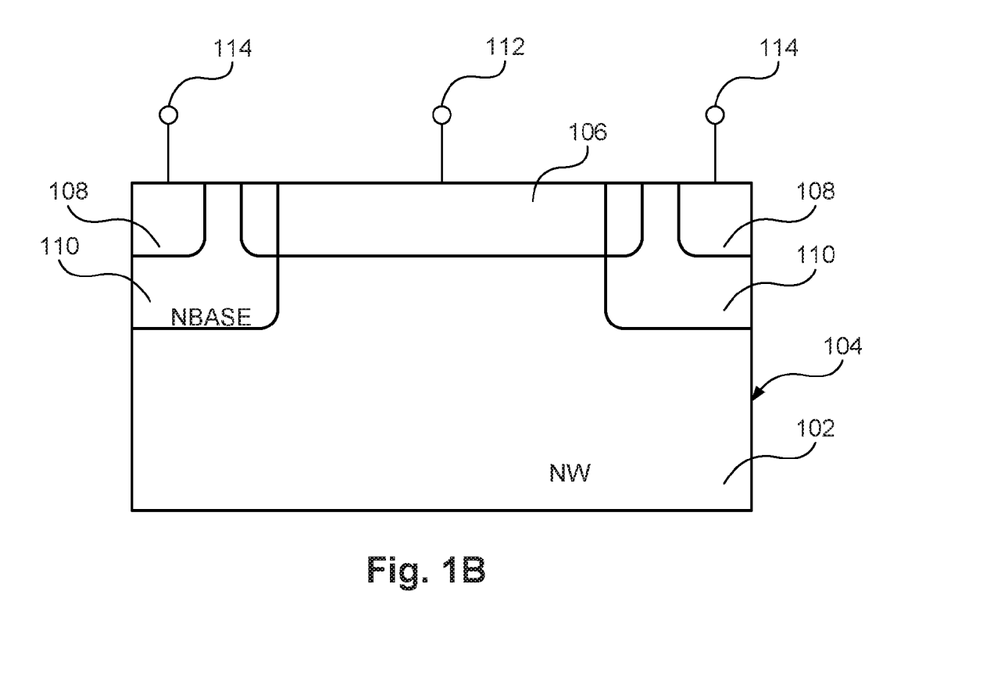
FIG. 1B shows a cross-sectional view along section line AA' in FIG. 1A.

FIG. 1A shows a plan view of an example of an n-type base Zener diode 100. FIG. 1B shows a cross-sectional view along a section line AA' illustrated in FIG. 1A. Zener diode 100 is formed in an n-type well region (N-Well or NW) 102 of a semiconductor substrate 104, and includes a p+ doped region 106, at least one n+ doped region 108, and at least one n-type base region (NBASE) 110. An anode 112 of diode 100 is coupled to p+ doped region 106, and at least one cathode electrode 114 is coupled to n+ doped region 108.

Figure 2A:
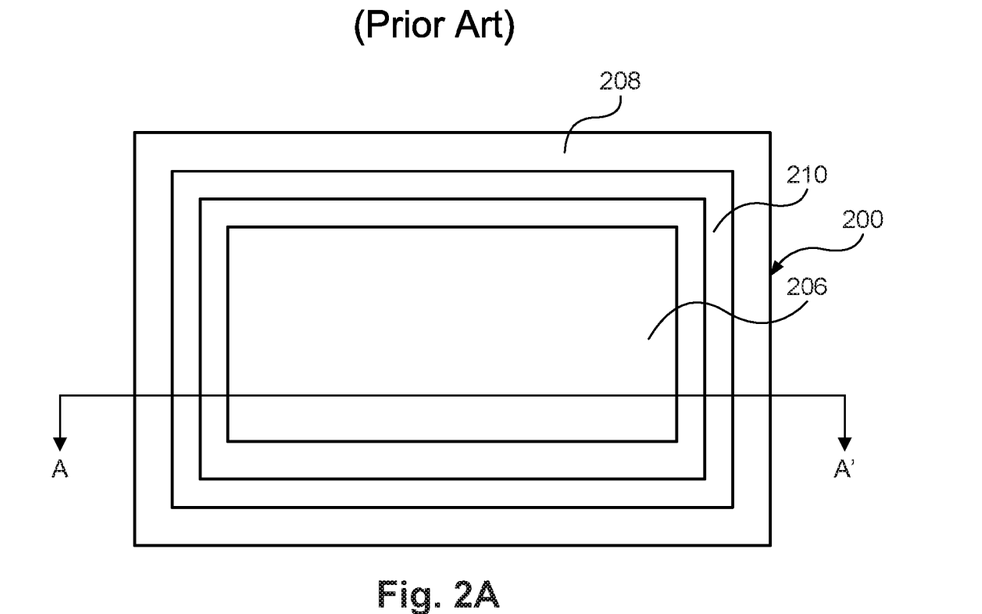
FIG. 2A shows a plan view of a conventional Zener diode.
Figure 2B:
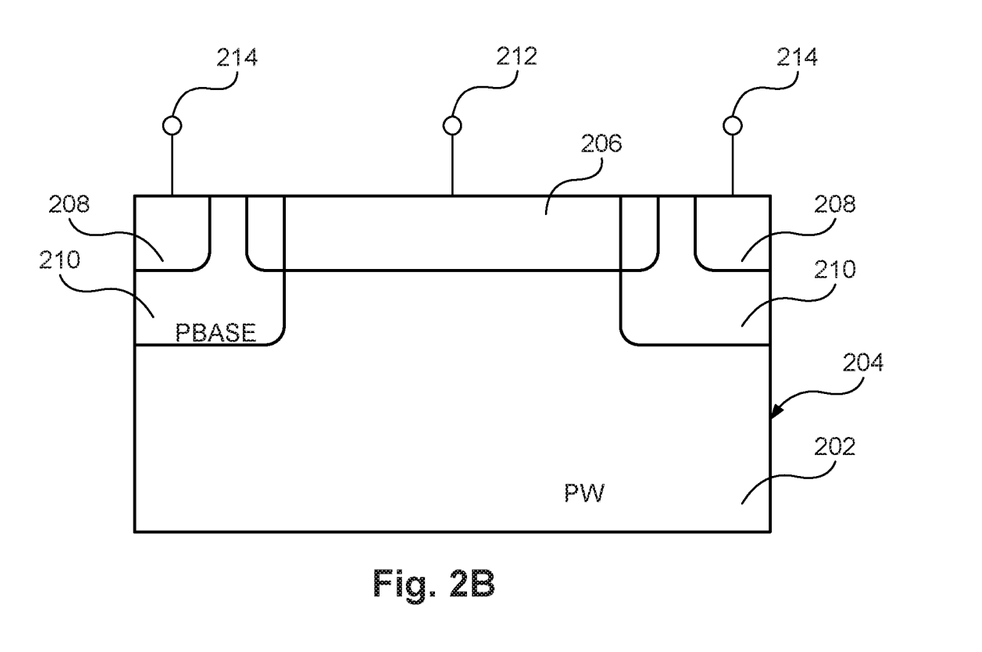
FIG. 2B shows a cross-sectional view along section line AA' in FIG. 2A.

FIG. 2A shows a plan view of an example of a p-type base Zener diode 200. FIG. 2B shows a cross-sectional view along a section line AA' as illustrated in FIG. 2A. Zener diode 200 is formed in a p-type well region (P-Well or PW) 202 of a semiconductor substrate 204, and includes an n+ doped region 206, at least one p+ doped region 208, and at least one p-type base region (PBASE) 210. A cathode 212 of diode 200 is coupled to n+ doped region 206, and at least one anode electrode 214 is coupled to p+ doped region 208.

As shown in FIGS. 1A, 1B, 2A, and 2B, Zener diodes have doped regions, such as regions 106, 108, 206, and 208, in the shape of a rectangle. The switching speed of Zener diodes may be increased to avoid circuit failure caused by the slow switching behavior, thereby improving device performance.

Figure 3A:
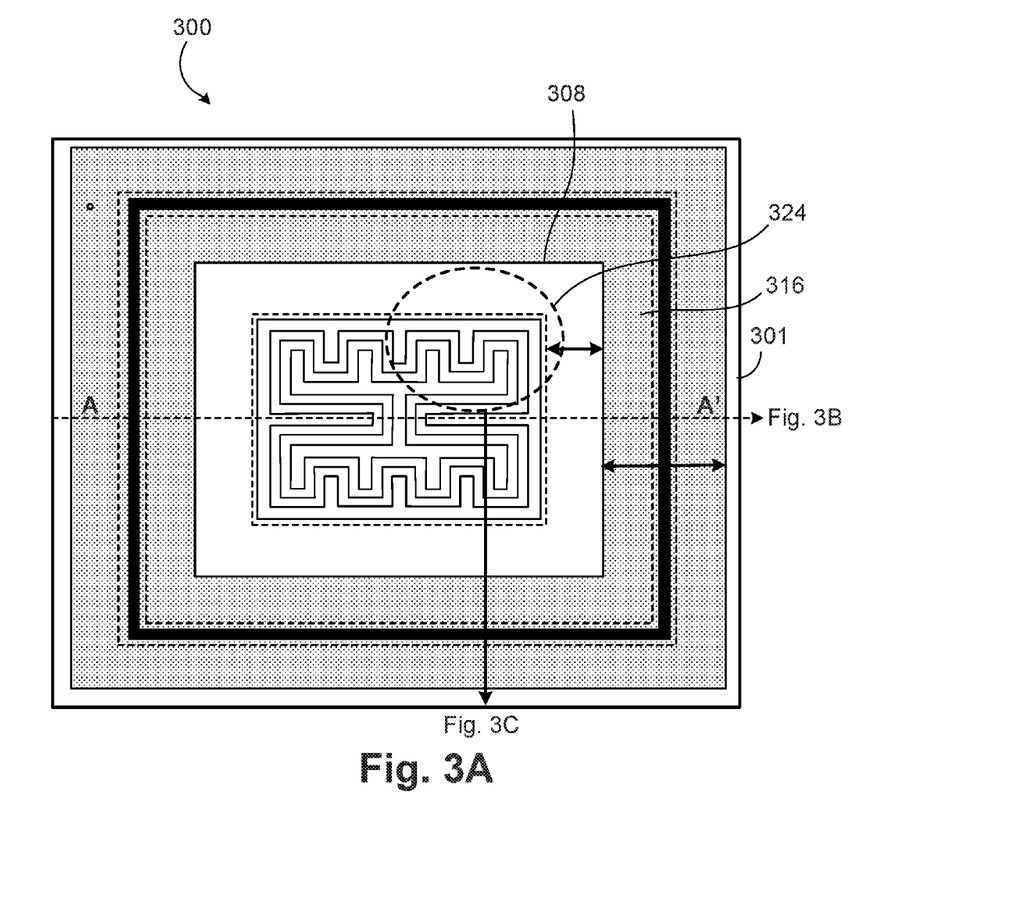
FIGS. 3A-3C show various plan views and a cross-sectional view of an exemplary semiconductor device consistent with some embodiments of this disclosure.
Figure 3B:
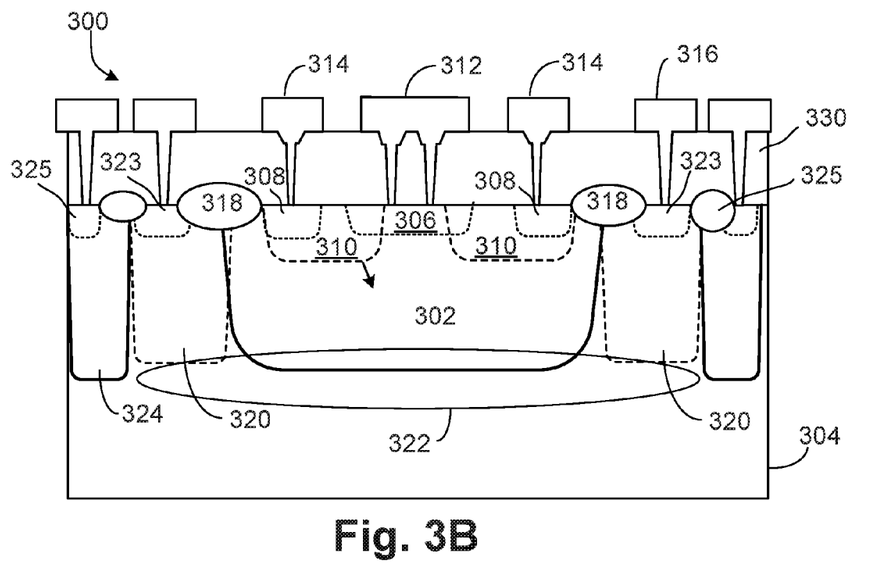
Figure 3C:
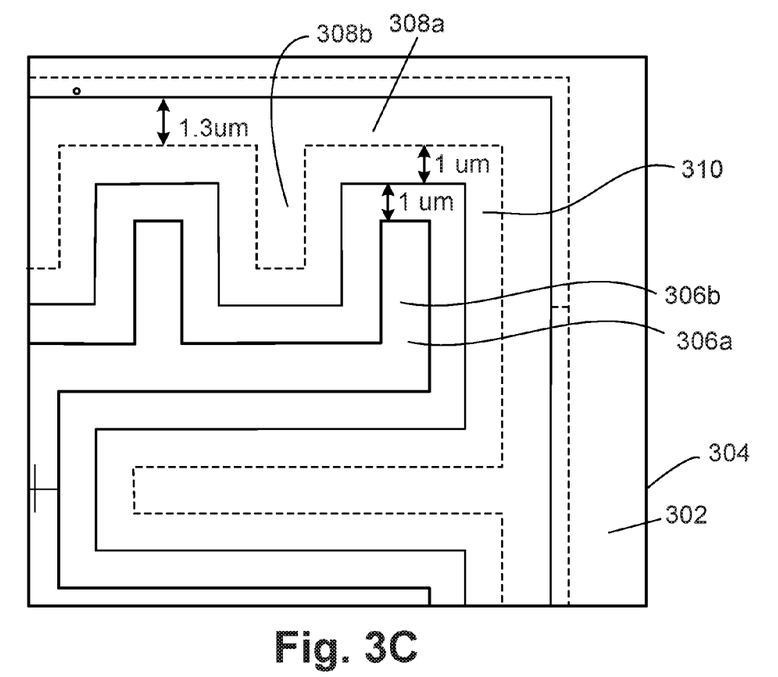

FIGS. 3A-3C show various plan views and a cross-sectional view of an exemplary integrated circuit (IC) device 300 with Zener diode 301 consistent with some embodiments of this disclosure. FIG. 3B shows a cross-sectional view along a section line AA' illustrated in FIG. 3A while FIG. 3C shows a blown-up view of the dashed circle region illustrated in FIG. 3A. Referring to FIGS. 3A-3C, Zener diode 301 is formed in a first-conductivity-type semiconductor substrate 304. A first-conductivity-type well region may be formed by doping the semiconductor substrate 304 with a first-conductivity-type dopant. The first-conductivity-type can be either p-type or n-type. Specifically, Zener diode 301 is formed over a first-conductivity-type well region 302 in the substrate 304. As illustrated, this first-conductivity type well region 302 is surrounded by fourth impurity region 320 on the sides and covered by barrier layer 322 on the bottom. In more detail, Zener diode 301 includes a first impurity region 306 doped with a first-conductivity-type dopant, at least one second impurity region 308 doped with a second-conductivity-type dopant, and at least one base region (third impurity region) 310. In the illustrated example, the base region (third impurity region) 310, the barrier layer 322 and the fourth impurity region 320 are doped with the second-conductivity-type dopant. The second impurity region 308 has a higher doping concentration than the base region (third impurity region) 310. The first-conductivity-type and the second-conductivity-type are opposite types. While the first-conductivity-type can be p-type, the second conductivity-type can be n-type. While the first-conductivity-type can be n-type, the second conductivity type can be p-type. Semiconductor substrate 304 may be, for example, a p-type or n-type silicon substrate. In some embodiments, second impurity region 308 is disposed in base region (third impurity region) 310 and has a depth shallower than that of base region (third impurity region) 310. A portion of the second impurity region 308 overlaps with a portion of the base region (third impurity region) 310. First impurity region 306 is disposed in well region 302 and has a depth shallower than that of base region (third impurity region) 310. A portion of first impurity region 306 overlaps base region (third impurity region) 310. A portion of the base region (third impurity region) 310 is disposed between the first impurity region 306 and the second impurity region 308. A first electrode 312 of diode is coupled to first impurity region 306, and at least one second electrode 314 is coupled to second impurity region 308.

Consistent with an exemplary embodiment, FIG. 3B particularly shows two second impurity regions 308 embedded in two base regions 310, and each of base regions 310 partially overlaps with first impurity region 306. More interestingly, fourth impurity region 320 is disposed around the exterior of well region 302 and extends about as deep as that of well region 302. The fourth impurity region 320 and the barrier layer 322 enclose the well region 302 from around and below, respectively, to form a charge barrier. A fifth impurity region 324 is disposed around the exterior of the fourth impurity region 320 extending as deep as that of the fourth impurity region 320 and reaches a depth of the barrier layer 322. In particular, fourth impurity region 320 surrounds the well region 302 which, in turn, supports base region 310 on the sides. Moreover, barrier layer 322 lies beneath the well region 302. The barrier layer 322 and the fourth impurity region 320 have the same conductivity type. As illustrated, fourth impurity region 320 and barrier layer 322 enclose the well region 302 from around and below, respectively. Because of this charge barrier formed by surrounding wall (fourth impurity region 320) and the barrier layer 322, the leakage current from within the charge barrier can be blocked. In other words, leakage current emancipating from the active regions of first impurity region 306 and second impurity region 308 to the fifth impurity region 324 or to substrate 304 can be blocked. Thus, leakage current—when Zener diode 301 experiences a forward bias voltage applied between the first impurity region 306 and the third impurity region 310—can be mitigated. A third electrode 316 is coupled to a top portion (sixth impurity region 323) of fourth impurity region 320. The sixth impurity region 323 has the same conductivity type as the fourth impurity region 320. However, the doping concentration in sixth impurity region 323 could be higher than the fourth impurity region 320. In some instances, electrode 316 is shorted to electrode 312 by metal routing of semiconductor device 300. Because electrode 316 is on top of the six impurity region 323 and electrode 312 is on top of the first impurity region 306, the six impurity region becomes electrically connected to the first impurity region to have the same potential. As illustrated, electrode 312 is coupled to the first impurity region 306 via the dielectric layer 330. Electrode 314 is coupled to the second impurity region 308 via the dielectric layer 330. Electrode 316 is coupled to the six impurity region 323 via the dielectric layer 330.

In more detail, during normal operation of device 300, Zener diode 301 is operated at reverse bias (for example, applied as a reverse voltage offset between first impurity region 306 and third impurity region 310). However, when Zener diode 301 is operating at forward bias (for example, applied as a forward voltage offset between first impurity region 306 and third impurity region 310), Zener diode 301 is susceptible to unwanted parasitic PNP bipolar junction transistor (BJT) turn-on that can induce leakage current outflow from active regions of first impurity region 306 and second impurity region 308 to fifth impurity region 324. In particular, when the voltage that develops across a junction between a wall area of well region 302 and barrier layer 322, or a junction between a wall area of well region 302 and forth impurity region 320 is greater than about 0.7V, then the base-emitter junction is forward-biased which gives rise to the parasitic BJT turn-on. This parasitic BJT can also manifest as current leakage—in the absence of fourth impurity region 320 and barrier layer 322—when a voltage bias develops across a junction between a wall area of well region 302 and fifth impurity region 324. In the illustration of FIG. 3B, fourth impurity region 320 and barrier layer 322 is shorted with port 312. In this example, the parasitic BJT would not be activated due to the equalized potential between a wall area of well region 302 and the surrounding fourth impurity region 320. The parasitic BJT may not be activated to allow the flow of leakage current from the active regions of first impurity region 306 and second impurity region 308 to the fifth impurity region 324 and substrate 304. As the Zener diode 301 operates in forward conduction region, the junction between fourth impurity region 320 and the substrate region would be reverse biased, which means current flow could not pass. The same applies to the junction between the barrier layer 322 and the substrate region. In fact, the fourth impurity region 320 and the barrier layer 322 form an enclosure that shields the active regions of first impurity region 302 and second impurity region 304. In these instances, additional bias for fourth impurity region 320 and the barrier layer 322 may not be necessary. Hence, Zener diode 301 can obviate the leakage current under forward conduction mode while maintaining normal operation under reverse mode.

Figure 4A:
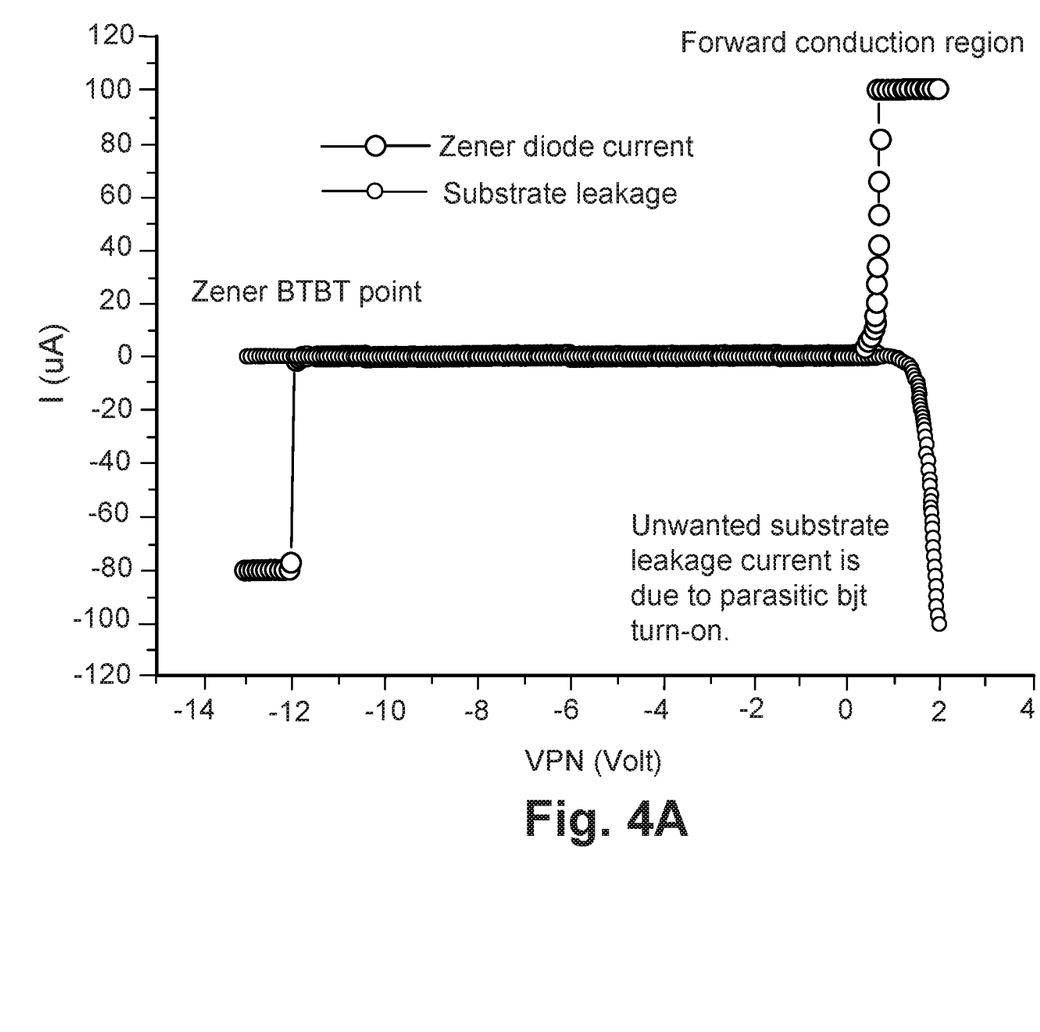
FIGS. 4A-4B illustrate current values when various forward and backward voltages are applied to an exemplary semiconductor device consistent with some embodiments of this disclosure.
Figure 4B:
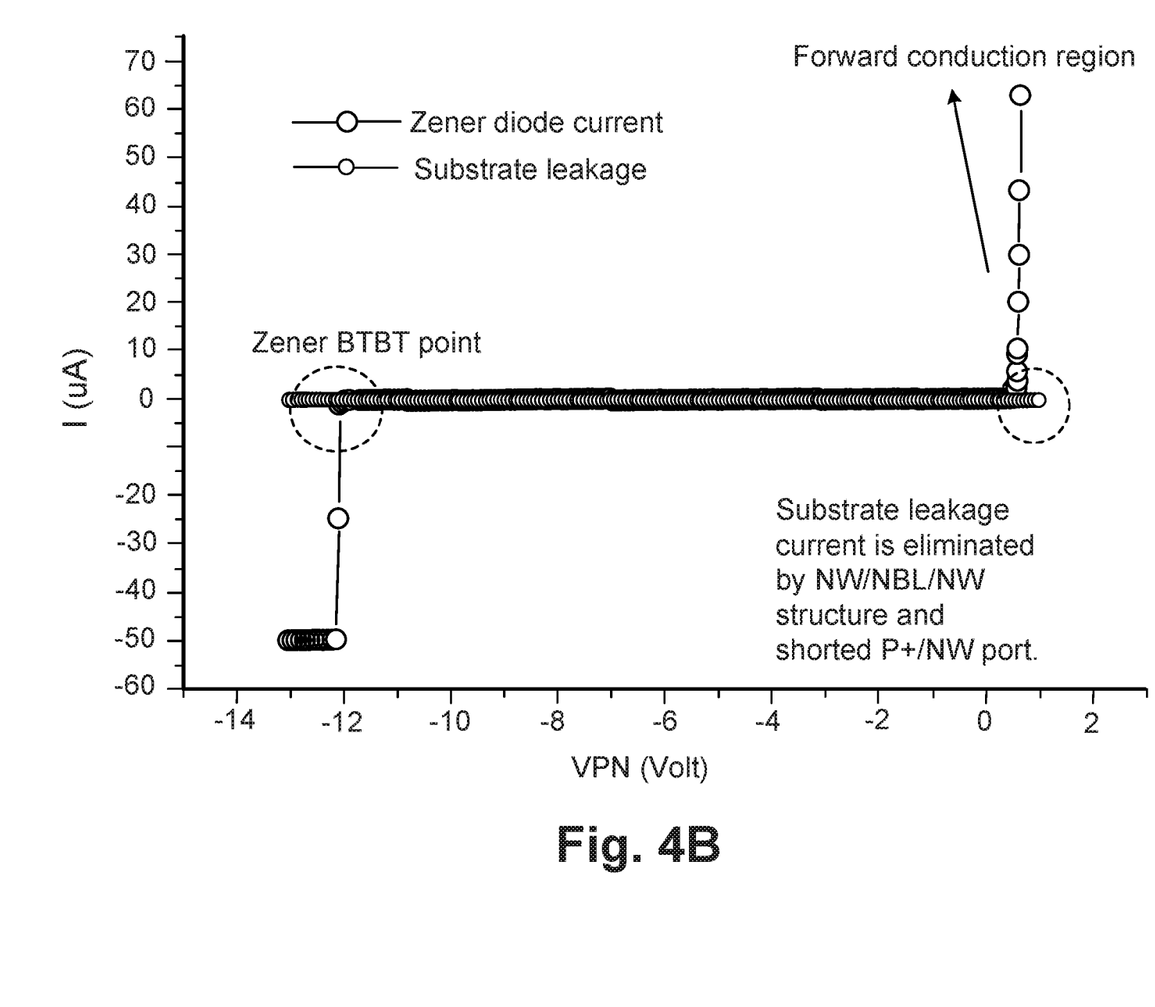

FIGS. 4A and 4B respectively show, for a Zener diode device without the disclosed charge barrier (formed by fourth impurity region 320 and barrier layer 322) and a Zener diode device with the disclosed charge barrier (formed by fourth impurity region 320 and barrier layer 322), the current and bias-voltage curves. As illustrated by the comparison between FIGS. 4A and 4B, the forward leakage current for Zener diode device 301 (with the disclosed charge barrier) is effectively mitigated. In summary, as shown in FIG. 4B, Zener diode 301 with the disclosed charge barrier could operate not only in the reverse bias for power clamp applications but also in forward bias because the parasitic BJT is not be activated at forward bias. In contrast, for Zener structure without the disclosed charge barrier, a large substrate leakage current can develop at forward bias, as shown in FIG. 4A. The drawback of this large substrate leakage current can be eliminated by, for example, a combination of the disclosed charge barrier structures of Zener diode 301 and metal routing configurations of Zener diode 301. The performance improvement arising from the elimination of leakage current becomes evident by a comparison of FIGS. 4A and 4B.

Returning to FIGS. 3A-3C, Zener diode 301 may further include fifth impurity region 324 that extends to the edges of barrier layer 322. The fifth impurity region 324 surrounds the fourth impurity region 320. Isolation regions 318 may be formed between second impurity region 308 and the sixth impurity region 323. Isolation region 318 may include field oxide, shallow trench isolation (STI) or other suitable dielectric structures. Referring to FIG. 3C, first impurity region 306 includes first branch 306a extending in a first direction, e.g., the horizontal x direction, and at least one second branch 306b (two branches are shown) extending from first branch 306a in a second direction, e.g., the vertical y direction, which is different from the first direction. Second impurity region 308 includes third branch 308a extending in a third direction, e.g., substantially in the x direction, and at least one fourth branch 308b (three branches are shown) extending from third branch 308a in a fourth direction, e.g., substantially in the y direction, which is different from the third direction. Second branch 306b of first impurity region 306 and fourth branch 308b of second impurity region 308 are disposed to interlace with each other. First impurity region 306 and second impurity region 308 are separated by base region 310. As illustrated, the distance between the first impurity region and the second impurity region is about 1-2 μm. The overlay between the first impurity region 306 and base region 310 may be about 1 μm. The overlay between the second impurity region 308 and base region 310 may also be about 1 μm. The width of the fourth impurity region 320 may be about 4-10 μm. The distance between the fourth impurity region 320 and the second impurity region 308 may be about 5 μm. Although specific numbers of branches are illustrated in FIG. 3C, the numbers are not limited and can be more or less than those illustrated. In the illustrated embodiment, the x and y directions are mutually orthogonal.

Still referring to FIG. 3C, first impurity region 306 has a shape of a comb/fork having second branches 306b extended along the y direction to point toward third branch 308a of second impurity region 308. Second impurity region 308 also has a shape of a comb/fork having fourth branches 308b extending along the y direction to point toward first branch 306a of first impurity region. A free end of each of second branches 306b of first impurity region 306 is disposed adjacent to third branch 308a of second impurity region 308. A free end of fourth branches 308b of second impurity region 308 is disposed adjacent to first branch 306a of first impurity region 306. As shown in FIG. 3C, at least one second branch 306b is disposed between a pair of fourth branches 308b, and at least one fourth branch 308b is disposed between a pair of second branches 306b. As compared to a Zener diode device having the same area but without such intertwined arrangements of the first impurity region and the second impurity region, the layout of impurity regions shown in FIGS. 3A and 3C increases the junction area, e.g., the interface between first impurity region 306 and base region 310, by about 90%, which increases the current flow from the Zener breakdown.

Figure 5A:
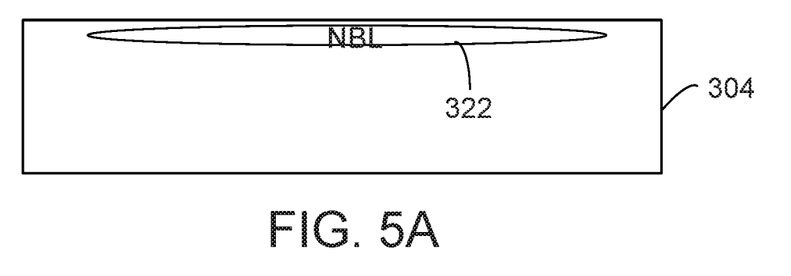
FIGS. 5A-5G show an exemplary process for manufacturing a semiconductor device consistent with some embodiments of this disclosure.
Figure 5B:
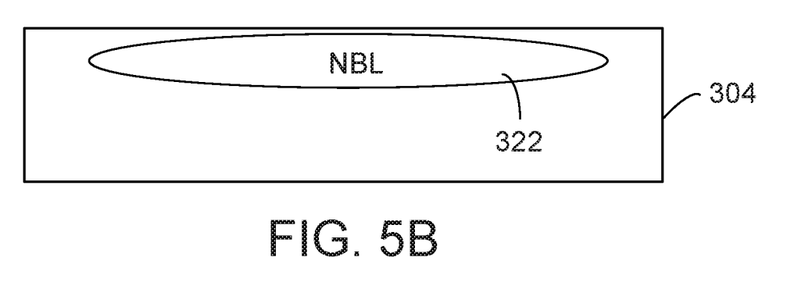
Figure 5C:
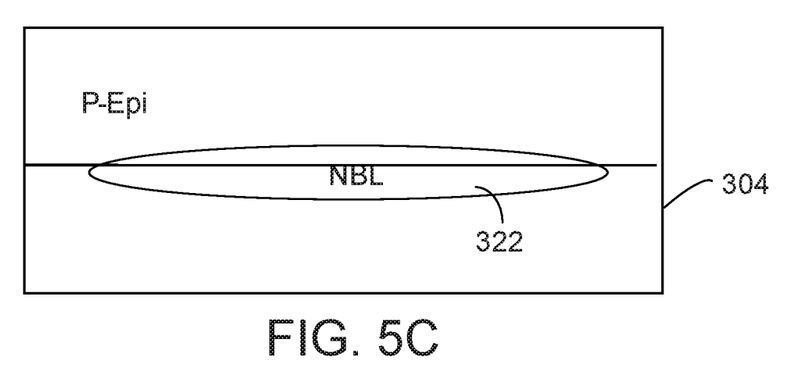

In some embodiments, the first-conductivity-type is n-type and the second-conductivity-type is p-type, or vice versa. For example, in an n-type base Zener diode 301, well region 302 is p-type; first impurity region 306 is a p+ region having a doping concentration of $10^{18}$ to $10^{20}$ atoms/cm$^3$; second impurity region 308 is an n+ region having a doping concentration of $10^{18}$ to $10^{20}$ atoms/cm$^3$; and base region 310 is an n region having a doping concentration of $10^{16}$ to $10^{19}$ atoms/cm$^3$, provided that second impurity region 308 has a higher doping concentration than that of base region 310. The doping concentration of base region 310 depends on a desired Zener breakdown voltage. More specifically, the doping concentrations of base (third impurity) region 310 and first impurity region 306 are tuning parameters to achieve a desired Zener breakdown voltage. The doping concentration of second impurity region 308 is greater than that of well region 302. In a p-type base Zener diode, well region 302 is n-type; first impurity region 306 is an n+ region having a doping concentration of $10^{18}$ to $10^{20}$ atoms/cm$^3$; second impurity region 308 is a p+ region having a doping concentration of $10^{18}$ to $10^{20}$ atoms/cm$^3$; and base region 310 is a p region having a doping concentration of $10^{16}$ to $10^{19}$ atoms/cm$^3$. In some embodiments, the n-type dopant can be phosphorus or arsenic, and the p-type dopant can be boron FIGS. 5A-5G show an exemplary process for manufacturing integrated circuit (IC) device 300, including a Zener diode 301 consistent with embodiments of this disclosure. Initially, dopants of a second-conductivity-type can be introduced in substrate 304 to form barrier layer 322 of a second-conductivity-type. In some examples, barrier layer 322 is selectively implanted in the substrate 304 in predetermined areas, for example, by lithography to expose the predetermined areas for the implantation to take place, as illustrated in FIG. 5A. The implanted barrier layer 322 is then expanded via the use of a high temperature diffusion process, as shown in FIG. 5B. Thereafter, an epitaxial growth process is performed on barrier layer 322 to form an epitaxy layer. In this illustration of FIG. 5C, the epitaxial growth process is of a first-conductivity-type that is different from the barrier layer. The epitaxy layer could act as a part of the semiconductor substrate 304.

Figure 5D:
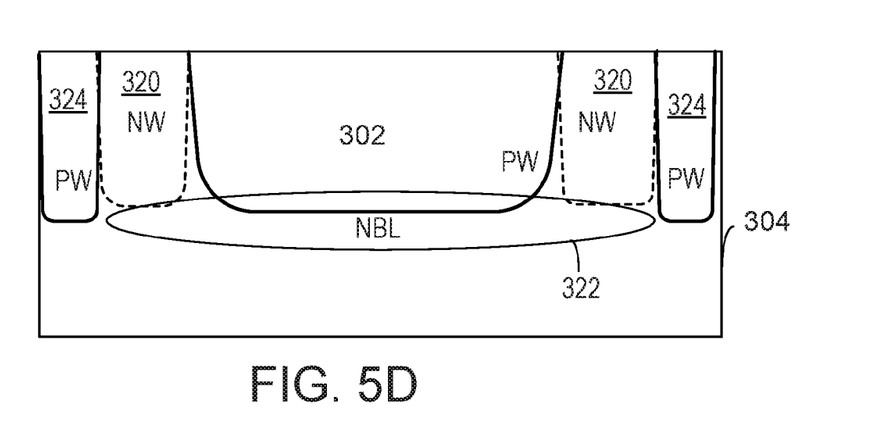

Referring to FIG. 5D, dopants of a first-conductivity-type can be introduced to form a well region of a first-conductivity-type, such as well region 302, in the newly formed epitaxy layer and above barrier layer 322 of the second-conductivity-type. The well region 302 may be formed by ion implantation. In some instances, ion implantation may be followed by high temperature diffusion. Similarly, fourth impurity region 320, which is of a conductivity type different from well region 302 may be then formed in epitaxial layer to surround the well region 302. Fourth impurity region 320 may be formed by ion implantation. In some instances, the ion implantation process may be followed by a high temperature diffusion process. Likewise, fifth impurity region 324, which is of the same conductivity type as well region 302 may be then formed in epitaxial layer to surround the fourth impurity region 320. The formation of fifth impurity region 324 may be accomplished by ion implantation, followed by high temperature diffusion. The ion implantation process described above may generally include annealing.

Figure 5E:
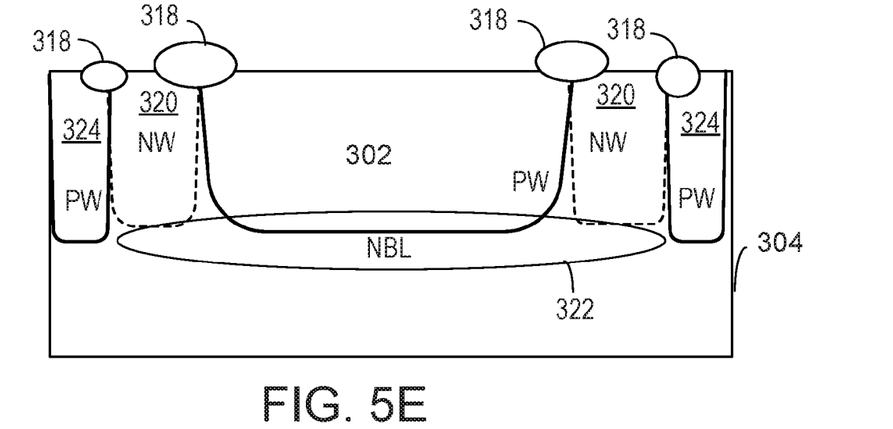
Figure 5F:
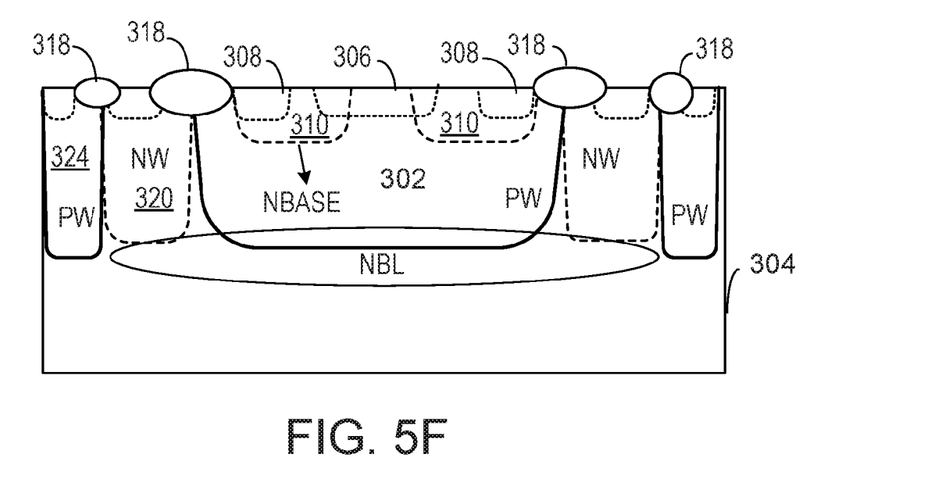

Turning to FIGS. 5E and 5F, isolation region 318, such as field oxide, may be formed by field oxide growth. As illustrated, the isolation region 318 may be disposed at a periphery of a subsequently formed third impurity region 310 and located between an outer boundary of the third impurity region 310 and an inner boundary of fourth impurity region 320. The isolation region 318 may be disposed at a periphery of the fourth impurity region 310 and located between an outer boundary of the fourth impurity region 320 and an inner boundary of the fifth impurity region 324.

Figure 5G:
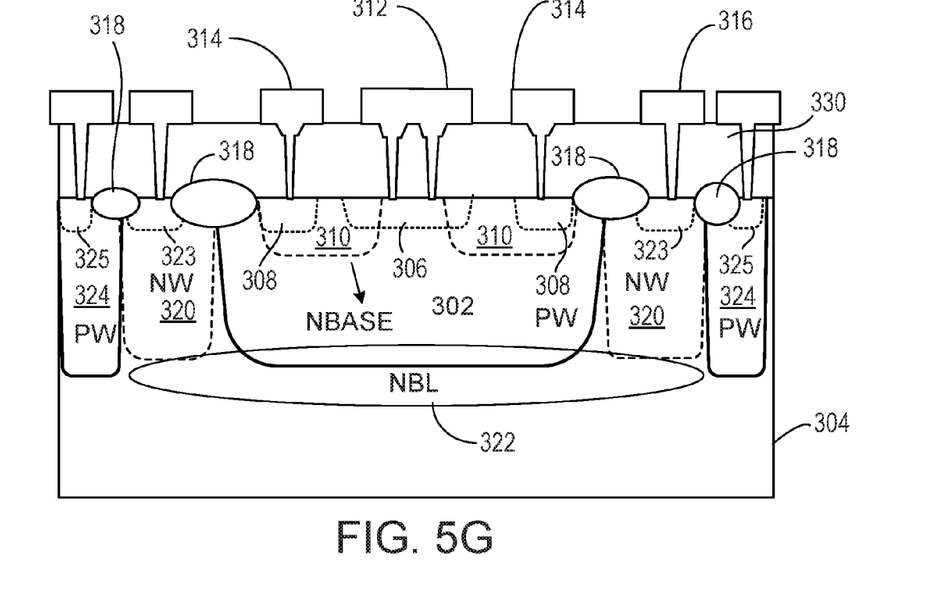

Referring to FIGS. 5F-5G, various impurity regions are defined so that the general structure of a Zener diode 301 is defined. A first impurity region 306 of a first-conductivity-type is formed in the well region 302. The formation generally includes introducing dopants of a first-conductivity-type, for example, by ion implantation, in the well region 306. In some examples, a high temperature thermal process is performed to spread dopants from regions of higher concentration to regions of lower concentration. The first impurity region 306 may be defined through doping using dopants of the first conductivity type. The second impurity region 308 and base region (third impurity region) 310 may be defined through doping using dopants of the second-conductivity-type, that is opposite to the first-conductivity-type. The doping concentration in the second impurity region 308 is higher than in the base region (third impurity region) 310. Similarly, top portions (six impurity region 323) of fourth impurity region 320 may be subject to a higher doping concentration of dopants of the second-conductivity-type. Likewise, top portions (seventh impurity region 325) of fifth impurity region 324 may be subject to a higher doping concentration of dopants of the first-conductivity-type.

The first impurity region 306 has more than one branch as shown in FIGS. 3A and 3C. The second-conductivity-type is opposite to the first-conductivity-type. A portion of the first impurity region is formed to overlap a first portion of the third impurity region 310. The second impurity region 308 has more than one branch. As illustrated, a second portion of the third impurity region 310 is disposed between the first impurity region 306 and the second impurity region 308.

As discussed, fourth impurity region 320 surrounds well region 302 which, in turn, supports base region 310 on the sides and on the bottom. The barrier layer 322 and the fourth impurity region 320 are of the same conductivity type. As demonstrated, the fourth impurity region 320 and the barrier layer 322 form a charge barrier to mitigate a leakage current from active regions of the first impurity region 306 and the second impurity region 308 outward to, for example, the fifth impurity region 324 when a forward bias is being applied to the first impurity region 306 and the third impurity region 310.

Referring to FIG. 5G, a dielectric layer 330 may be formed over the various impurity regions through a deposition process. A metal plug may then be formed for each of the impurity regions. For example, electrodes 312, 314, and 316 are respectively formed over first impurity region 306, the second impurity region 308 and a top portion of the fourth impurity region 320 (i.e., sixth impurity region 323), as illustrated. Moreover, a metal route may be formed between electrode 312 for the first impurity region and the electrode 316 for the top portions of the fourth impurity region 320 (i.e., sixth impurity region 323). Electrode 312, 314, and 316 are formed to couple to each of first impurity region 306, the second impurity region 308 and the fourth impurity region 320 through the dielectric layer.

Figure 6:
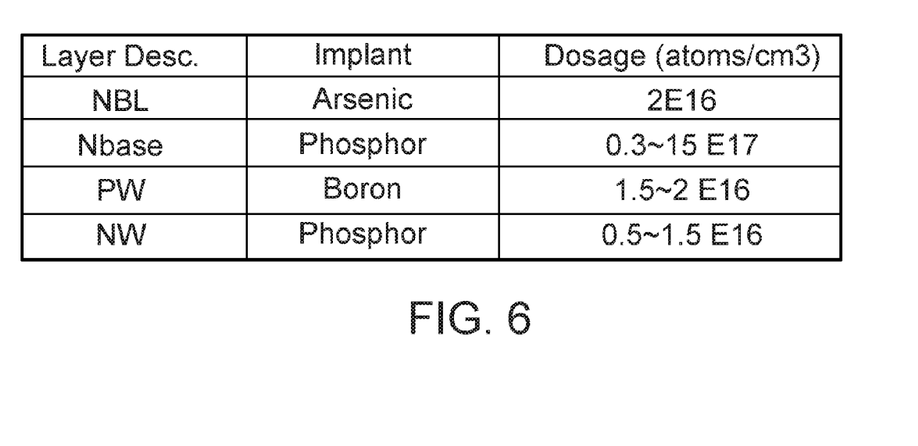
FIG. 6 is a table showing examples of implant and doping concentrations for representative structures described in some embodiments of this disclosure.

FIG. 6 is a table showing examples of implant and doping concentrations for representative structures described in some embodiments of the disclosure. For example, the implant used for implanting the barrier layer 322 maybe arsenic and may have a doping concentration of about $2 \times 10^{16}$ atoms/cm$^3$. The implant used for implanting the third impurity region 310 (e.g., an Nbase area) may include phosphor and may have a doping concentration of about $0.3$-$15 \times 10^{17}$ atoms/cm$^3$. The implant used for implanting the fourth impurity region 320 (e.g., an NW area) may include phosphor and may have a doping concentration of $0.5$-$1.5 \times 10^{16}$ atoms/cm$^3$. The implant used for implanting the fifth impurity region 324 (e.g., a PW area) may include Boron and may have a doping concentration of $0.5$-$1.5 \times 10^{16}$ atoms/cm$^3$.

The examples of IC devices that include a Zener diode as illustrated in this disclosure can be used in a voltage regulator, voltage shifter or waveform clipper, transient voltage suppressor, or any other circuit that uses a Zener diode.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device having a Zener diode, the semiconductor device comprising:
   a substrate;
   a well region of a first-conductivity-type, disposed in the substrate;
   a first impurity region of the first-conductivity-type disposed in the well region;
   a second impurity region of a second-conductivity-type disposed in the well region, the second-conductivity-type being opposite to the first-conductivity-type;
   a third impurity region disposed in the well region, a portion of the first impurity region overlapping a first portion of the third impurity region, a portion of the second impurity region overlapping a second portion of the third impurity region, and a third portion of the third impurity region being disposed between the first impurity region and the second impurity region; and
   a fourth impurity region and a barrier layer disposed in the substrate, the fourth impurity region and the barrier layer enclosing the well region from around and below, respectively.

2. The semiconductor device of claim 1, wherein the third impurity region is of the second-conductivity-type while the fourth impurity region is also of the second-conductivity-type.

3. The semiconductor device of claim 1, further comprising a fifth impurity region disposed in the substrate and surrounding the fourth impurity region.

4. The semiconductor device of claim 3, wherein the fifth impurity region is of the first-conductivity-type.

5. The semiconductor device of claim 4, wherein the fourth impurity region and the barrier layer forms a charge barrier that blocks a leakage current from within the charge barrier to the fifth impurity region or to the substrate.

6. The semiconductor device of claim 5, wherein a forward bias is applied to the first impurity region and the third impurity region.

7. The semiconductor device of claim 5, wherein the leakage current being blocked emancipates from active regions of the first impurity region or the second impurity region.

8. The semiconductor device of claim 5, wherein the fourth impurity region is connected to the first impurity region by metal routing of the semiconductor device.

9. The semiconductor device of claim 3, further comprising:
   a dielectric layer disposed on the substrate;
   a sixth impurity region disposed in the fourth impurity region, the sixth region having the same conductivity type as the fourth impurity region but doped with a higher concentration of dopants than the fourth impurity region;
   a first electrode coupled to the first impurity region via the dielectric layer;
   a second electrode coupled to the second impurity region via the dielectric layer; and
   a third electrode coupled to the sixth impurity region via the dielectric layer,
   wherein the third electrode is shorted to the first electrode such that the sixth impurity region is electrically connected to the first impurity region and that a leakage current—from within a charge barrier to the fifth impurity region or to the substrate—is blocked.

10. The semiconductor device of claim 9, further comprising a first isolation region located between an outer boundary of the third impurity region and an inner boundary of the fourth impurity region, and a second isolation region located between an outer boundary of the fourth impurity region and an inner boundary of the fifth impurity region.

11. The semiconductor device of claim 1, wherein the second impurity region has a doping concentration greater than a doping concentration of the third impurity region.

12. The semiconductor device of claim 1, wherein the first impurity region has a first plurality of branches while the second impurity region has a second plurality of branches.

13. The semiconductor device of claim 12, wherein at least one portion of the first plurality of branches of the first impurity region interlaces with at least one portion of the second plurality of branches of the second impurity region.

14. A semiconductor device having a Zener diode, the semiconductor device comprising:
   a substrate;
   a well region of a first-conductivity-type, disposed in the substrate;
   a first impurity region of the first-conductivity-type disposed in the well region;

a second impurity region of a second-conductivity-type disposed in the well region, the second-conductivity-type being opposite to the first-conductivity-type;

a third impurity region disposed in the well region, wherein a portion of the third impurity region is disposed between the first impurity region and the second impurity region;

a fourth impurity region and a barrier layer disposed in the substrate, the fourth impurity region and the barrier layer respectively enclosing the well region from around and below to form a charge barrier;

a fifth impurity region disposed in the substrate and surrounding the fourth impurity region;

a first isolation region between an outer boundary of the third impurity region and an inner boundary of the fourth impurity region; and a second isolation region between an outer boundary of the fourth impurity region and an inner boundary of the fifth impurity region.

15. The semiconductor device of claim 14, wherein the second impurity region is located within the third impurity region, and wherein the second impurity region has a doping concentration greater than a doping concentration of the third impurity region.

16. The semiconductor device of claim 14, wherein no bias voltage is applied between the fourth impurity region and the first impurity region.

17. The semiconductor device of claim 14, wherein the first impurity region has a first plurality of branches while the second impurity region has a second plurality of branches, and wherein at least a first portion the first plurality of branches and at least a second portion of the second plurality of branches are complementary in shape.

* * * * *